United States Patent
Nordholt

(10) Patent No.: US 7,282,982 B2
(45) Date of Patent: Oct. 16, 2007

(54) MIXER-SYSTEM WITH GAIN-BLOCKS AND SWITCHES

(75) Inventor: Ernst Hugo Nordholt, Sassenheim (NL)

(73) Assignee: NXP B.V., Eindhoven (NL)

( * ) Notice: Subject to any disclaimer, the term of this patent is extended or adjusted under 35 U.S.C. 154(b) by 42 days.

(21) Appl. No.: 10/554,529

(22) PCT Filed: Apr. 27, 2004

(86) PCT No.: PCT/IB2004/050524

§ 371 (c)(1),
(2), (4) Date: Oct. 26, 2005

(87) PCT Pub. No.: WO2004/098043

PCT Pub. Date: Nov. 11, 2004

(65) Prior Publication Data

US 2007/0052469 A1   Mar. 8, 2007

(30) Foreign Application Priority Data

Apr. 29, 2003   (EP)   ................................. 03101180

(51) Int. Cl.
    *G06F 7/44* (2006.01)
(52) U.S. Cl. ....................... 327/355; 327/359
(58) Field of Classification Search ............ None
    See application file for complete search history.

(56) References Cited

U.S. PATENT DOCUMENTS

| | | | |
|---|---|---|---|
| 4,594,555 A * | 6/1986 | Hilton | 329/305 |
| 6,026,286 A * | 2/2000 | Long | 455/327 |
| 6,407,632 B1 * | 6/2002 | Madni et al. | 330/85 |
| 6,807,406 B1 * | 10/2004 | Razavi et al. | 455/313 |
| 6,965,655 B1 * | 11/2005 | Mostov et al. | 375/345 |
| 7,107,025 B2 * | 9/2006 | Khorram | 455/118 |
| 7,136,622 B2 * | 11/2006 | Rofougaran et al. | 455/20 |
| 7,161,406 B1 * | 1/2007 | Ferris | 327/359 |
| 7,194,242 B2 * | 3/2007 | Tanaka et al. | 455/127.3 |
| 2001/0018334 A1 * | 8/2001 | Ipek et al. | 455/318 |

FOREIGN PATENT DOCUMENTS

EP   0316999   5/1989

* cited by examiner

*Primary Examiner*—Cassandra Cox

(57) ABSTRACT

Mixer-systems comprising gain-blocks (1-4) and switches (5-8) have a flexibility depending upon their configuration (insight) and are made more flexible (basic idea) by supplying data input signals to the gain-blocks (1-4) and oscillation signals to the switches (5-6) for switching couplings between the gain-blocks (1-4). A switch (5-6) comprises a switch-transistor and a gain-block (1-4) either comprises a gain-block-transistor or comprises five gain-block-transistors for increasing the linearity of the mixer-system. The switches (5-6) have main electrodes which in the balanced situation are all coupled via four impedances (13-16) to the gain-blocks (1-4). In the single ended situation two main electrodes are coupled via two impedances (13,15,18,20) to the gain-blocks (1-4) and two others are coupled directly to the gain-blocks (1-4). By introducing further switches (7-8) parallel to the switches (5-6), harmonics can be suppressed. The basic mixer-system has an improved performance which can be further improved easily.

12 Claims, 3 Drawing Sheets

MIXER-SYSTEM WITH GAIN-BLOCKS AND SWITCHES

BACKGROUND

The invention relates to a mixer-system comprising gain-blocks and switches, and also relates to a gain-block-system for use in a mixer-system, and to a mixer for use in a mixer-system, and to a gain-block for use in a mixer-system and comprising at least a first, a second, a third, a fourth and a fifth gain-block-transistor, and to an apparatus which comprises a mixer-system, and to a method for mixing data input signals and oscillation signals.

Such an apparatus for example corresponds with a receiver for receiving modulated signals to be mixed (to be frequency translated or frequency converted) downwardly via a mixer-system or corresponds with a transmitter for transmitting modulated signals to be mixed (to be frequency translated or frequency converted) upwardly by a mixer-system etc.

DESCRIPTION OF THE RELATED ART

A prior art mixer-system is known from EP 0 316 999 A1, which discloses, in its FIG. 1, a mixer circuit comprising gain-blocks (transistors T5,T6) and mixers (transistors T1,T2,T3,T4).

The known mixer-system is disadvantageous, inter alia, due to being flexible insufficiently.

SUMMARY OF THE INVENTION

It is an object of the invention, inter alia, of providing a more flexible mixer-system.

Further objects of the invention are, inter alia, providing a gain-block-system for use in a more flexible mixer-system, and a mixer for use in a more flexible mixer-system, and a gain-block for use in a more flexible mixer-system, and an apparatus which comprises a more flexible mixer-system, and a more flexible method for mixing data input signals and oscillation signals.

The mixer-system according to the invention comprises gain-blocks and switches, wherein control electrodes of a first, a second, a third and a fourth gain-block constitute data inputs for guiding data input signals, with first main electrodes of the first and third gain-block being coupled to each other and to a first impedance and with first main electrodes of the second and fourth gain-block being coupled to each other and to a second impedance for constituting outputs for guiding output signals, and with second main electrodes of the first and second gain-block being coupled to each other via a first switch and with second main electrodes of the third and fourth gain-block being coupled to each other via a second switch, with control electrodes of the switches constituting oscillation inputs for guiding oscillation signals.

By using the first main electrodes of the four gain-blocks as outputs and by using the control electrodes of the four gain-blocks as data inputs, with the second main electrodes of the first and second gain-block being coupled via the first switch and with the second main electrodes of the third and fourth gain-block being coupled via the second switch, and by using the control electrodes of the switches as oscillation inputs, a new type of flexible mixer-system has been designed. Due to certain parts of this mixer-system being responsible for certain parameters (for certain parts of the performance) and other parts of the mixer-system being responsible for other parameters (for other parts of the performance), several parameters (several parts of the performance) can now be improved flexibly.

For example the linearity of the mixer-system will be solely determined by the linearity of the gain-blocks as long as the switches will have a sufficiently low on-resistance.

The data input signals for example comprise Radio Frequency (RF) signals like for example RF voltages or RF currents to be converted into RF voltages via resistors, etc. The output signals for example comprise Intermediate Frequency (IF) signals like for example IF currents, etc. The oscillation signals for example originate from an oscillator and for example comprise square wave signals like for example square wave voltages or square wave currents to be converted into square wave voltages via resistors, etc.

An input guiding a signal may correspond with a positive signal arriving at or being present at this input or with a negative signal leaving or being present at this input, and vice versa. And an output guiding a signal may correspond with a positive signal leaving or being present at this output or with a negative signal arriving at or being present at this output, and vice versa.

An embodiment of the mixer-system according to the invention is defined by each switch comprising at least one switch-transistor, with each gain-block comprising at least one gain-block-transistor.

By providing each switch with one switch-transistor and by providing each gain-block with one gain-block-transistor, a simple embodiment has been created requiring little chip surface.

An embodiment of the mixer-system according to the invention is defined by a third, fourth, fifth, sixth and seventh impedance.

By providing the mixer-system with the third, fourth, fifth, sixth and seventh impedance, a mixer-system has been created which, when driven by a balanced data input source, will have a good performance (low noise, low distorsion) due to parasitic capacitances of the switch-transistors carrying no or little differential data input signal.

An embodiment of the mixer-system according to the invention is defined by a third and fifth impedance.

By providing the mixer-system with the third and fifth impedance and leaving out the fourth, sixth and seventh impedance, the mixer-system can be driven in a single ended mode (by a single ended data input source).

An embodiment of the mixer-system according to the invention is defined by a third and fourth switch.

By providing the mixer-system with the third switch parallel to the first switch and with the fourth switch parallel to the second switch, with control electrodes of the third and fourth switch guiding the further oscillation signals, which further oscillation signals for example originate from a further oscillator and for example comprise further square wave signals at for example three or five or seven times etc. the frequency of the oscillation signals comprising for example the square wave signals, the third of fifth or seventh harmonic etc. is suppressed. Of course, dependently upon the gain of the mixer-system related to this third or fifth or seventh harmonic etc., values for the (further) oscillator and/or values for the (further) impedances will need to be chosen properly.

An embodiment of the mixer-system according to the invention is defined by an eighth, nineth, tenth, eleventh and seventh impedance.

By providing the mixer-system with the eighth, nineth, tenth, eleventh and seventh impedance, a mixer-system has been created which, when driven by a balanced data input source, will have a good performance (low noise, low distorsion) due to parasitic capacitances of the switch-transistors carrying no or little differential data input signal.

An embodiment of the mixer-system according to the invention is defined by an eighth and tenth impedance.

By providing the mixer-system with the eighth and tenth impedance and leaving out the nineth, eleventh and seventh impedance, the mixer-system can be driven in a single ended mode (by a single ended data input source). Of course, the fifth and sixth embodiment respectively can be combined with the second and third embodiment respectively.

An embodiment of the mixer-system according to the invention is defined by a first, second, third, fourth and fifth gain-block-transistor.

By providing each switch with one switch-transistor and by providing each gain-block with the first, second, third, fourth and fifth gain-block-transistor, a highly linear mixer-system has been created, due to this gain-block applying negative feedback over several stages. This mixer-system will have an excellent performance (low noise, low distorsion) due to parasitic capacitances of the switch-transistors carrying no differential data input signal (a consequence of the fully balanced situation).

A current guiding terminal may supply a positive current leaving the terminal and flowing to the load or may supply a negative current arriving at the terminal via the load, or vice versa. A voltage guiding terminal may supply a positive voltage or a negative voltage. And of course, one or more of the second to sixth embodiments can be combined with this seventh embodiment.

Embodiments of the gain-block-system according to the invention and of the mixer according to the invention and of the gain-block according to the invention and of the apparatus according to the invention and of the method according to the invention correspond with the embodiments of the mixer-system according to the invention.

The invention is based upon an insight, inter alia, that the flexibility of a mixer-system depends upon its configuration, and is based upon a basic idea, inter alia, that for a more flexible configuration data input signals are to be supplied to the gain-blocks and that oscillation signals are to be supplied to switches for switching couplings between gain-blocks.

The invention solves the problem, inter alia, of providing a more flexible mixer-system, and is advantageous, inter alia, in that its performance is improved and can be further improved easily.

These and other aspects of the invention will be apparent from and elucidated with reference to the embodiments(s) described hereinafter.

DETAILED DESCRIPTION

Figure 1:
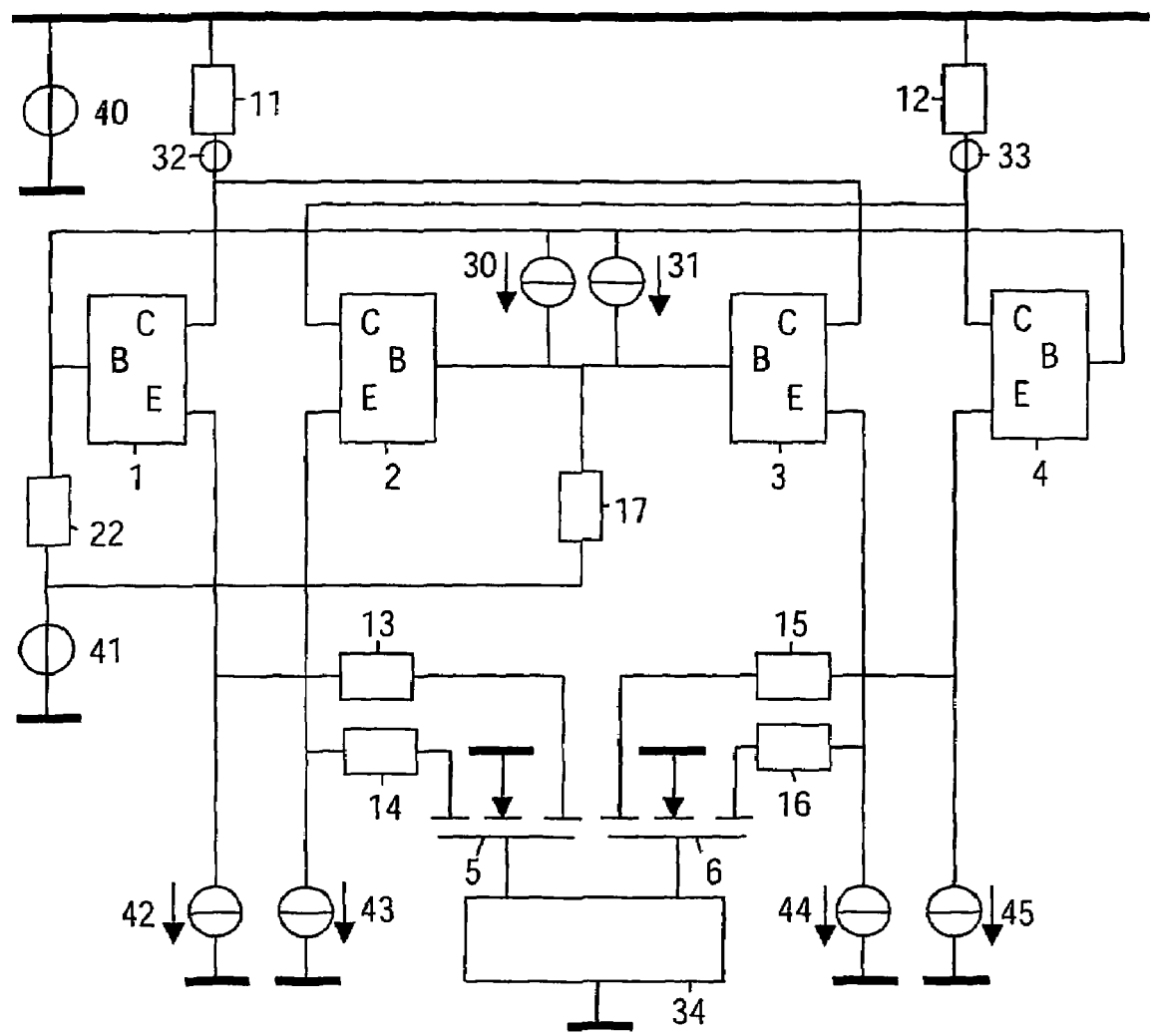
FIG. 1 illustrates in block diagram form a basic mixer-system according to the invention.

The basic mixer-system according to the invention shown in FIG. 1 comprises four gain-blocks 1-4 for example each comprising one transistor, like a bipolar transistor or a Field Effect Transistor (FET). Control electrodes (B) of gain-blocks 1 and 4 are coupled to each other and via a resistor 22 to a voltage source 41 (for biasing purposes) and to one side of current sources 30 and 31 which generate data input signals. The other side of current sources 30 and 31 is coupled to control electrodes (B) of gain-blocks 2 and 3, which are coupled to each other and via a seventh impedance 17 (like for example a resistor etc.) to voltage source 41 (for biasing purposes).

First main electrodes (C) of gain-blocks 1 and 3 are coupled to each other and constitute a first output 32 coupled via a first impedance 11 (like for example a resistor etc.) to a voltage source 40 (main supply). First main electrodes (C) of gain-blocks 2 and 4 are coupled to each other and constitute a second output 33 coupled via a second impedance 12 (like for example a resistor etc.) to voltage source 40. Voltage sources 40 and 41 are further coupled to ground.

Second main electrode (E) of gain-block 1 is coupled via a current source 42 (for biasing purposes) to ground and is coupled via a third impedance 13 (like for example a resistor etc.) to a first main electrode of a first switch 5 (for example comprising one or more switch-transistors, like a MOSFET). Second main electrode (E) of gain-block 2 is coupled via a current source 43 (for biasing purposes) to ground and is coupled via a fourth impedance 14 (like for example a resistor etc.) to a second main electrode of first switch 5. A control electrode of switch 5 is coupled to a first output of an oscillator 34 for receiving a first oscillation signal.

Second main electrode (E) of gain-block 4 is coupled via a current source 45 (for biasing purposes) to ground and is coupled via a fifth impedance 15 (like for example a resistor etc.) to a first main electrode of a second switch 6 (for example comprising one or more switch-transistor, like a MOSFET). Second main electrode (E) of gain-block 3 is coupled via a current source 44 (for biasing purposes) to ground and is coupled via a sixth impedance 16 (like for example a resistor etc.) to a second main electrode of second switch 6. A control electrode of switch 6 is coupled to a second output of oscillator 34 for receiving a second oscillation signal.

The mixer-system according to the invention has the advantage that the mixer (switches 5 and 6) are embedded in gain-blocks 1-4 which can be optimised for linearity and noise. The first and second oscillation signals are inverse signals like for example square wave signals etc., which drive one of the switches 5 and 6 in an on-state (low on-resistance) and the other one in an off-state (high off-resistance). Of a pair of gain-blocks 1,2 or 3,4, one of the gain-blocks will provide gain, where at that time the other one will not provide any output current. Of course, more than four gain-blocks may be implemented. Further, one may define the combination of two gain-blocks and one or two resistors as one voltage-to-current converter.

The mixer-system according to the invention will reject at its outputs 32,33 both the oscillation signals and the Radio Frequency (RF) components of the data input signals. For the switches 5,6 having a sufficiently low on-resistance, the linearity will be solely determined by the linearity of the gain-blocks 1-4.

The basic mixer-system shown in FIG. 1 will be driven with a balanced (RF) data input source. In case of needing to be driven with a single ended (RF) data input source, impedances 14, 16 and 17 are to be left out, due to both switch-transistors of switches 5,6 then needing to be located at those sides where the RF voltages are virtually zero.

Figure 2:
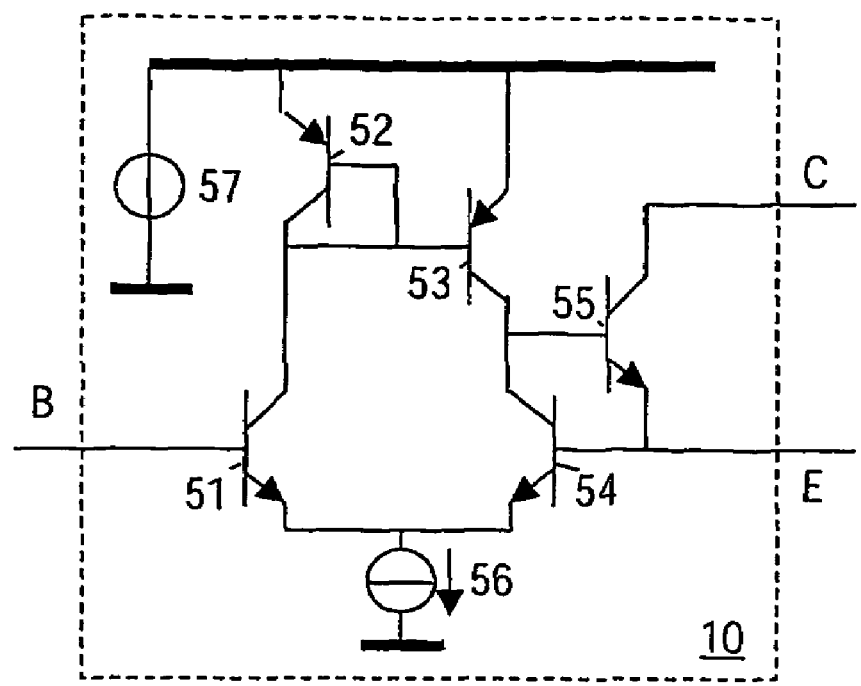
FIG. 2 illustrates in block diagram form a gain-block according to the invention for improving the basic mixer-system.

The gain-block 10 according to the invention shown in FIG. 2 improves the basic mixer-system shown in FIG. 1 due to having an improved linearity. Gain-block 10 for example corresponds with one or more of the gain-blocks 1-4 shown in FIG. 1 and comprises a first 51, a second 52, a third 53, a fourth 54 and a fifth 55 gain-block-transistor for example each comprising one transistor, like a bipolar transistor or a Field Effect Transistor (FET). A control electrode of the first gain-block-transistor 51 (for example npn) constitutes the control input (B) of the gain-block 10, with a first main electrode of the first gain-block-transistor 51 being coupled to a first main electrode and to a control electrode of the second gain-block-transistor 52 (for example pnp) and to a control electrode of the third gain-block-transistor 53 (for example pnp), with a second main electrode of the second gain-block-transistor 52 being coupled to a second main electrode of the third gain-block-transistor 53 and to a voltage guiding terminal coupled to a voltage source 57 which is further coupled to ground. A second main electrode of the first gain-block-transistor 51 is coupled to a second main electrode of the fourth gain-block-transistor 54 (for example npn) and to a current guiding terminal coupled to a current source 56 which is further coupled to ground, with a control electrode of the fourth gain-block-transistor 54 constituting the second main electrode (E) of the gain-block 10 and being coupled to a second main electrode of the fifth gain-block-transistor 55 (for example npn), with a first main electrode of the fourth gain-block-transistor 54 being coupled to a control electrode of the fifth gain-block-transistor 55 and to a first main electrode of the third gain-block-transistor 53, and with a first main electrode of the fifth gain-block-transistor 55 constituting a first main electrode of the gain-block (C).

When applying the gain-block 10 shown in FIG. 2 in each gain-block 1-4 shown in FIG. 1, due to the fully balanced nature of this mixer-system, parasitic capacitances of the switch-transistors of switches 5,6 will not carry any differential RF signal. This results in an excellent performance. Of course, other alternative gain-blocks are not to be excluded and may be used instead.

Figure 3:
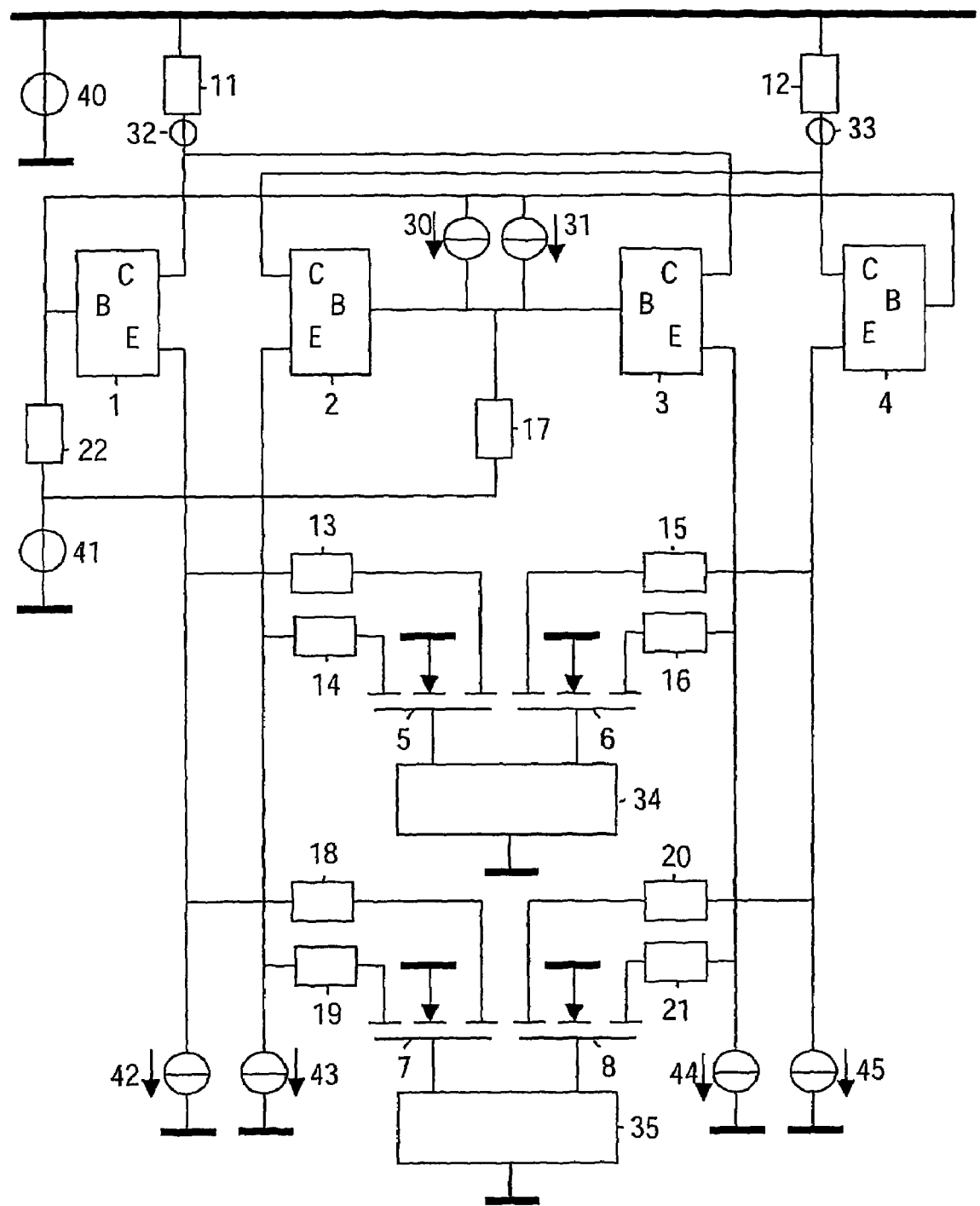
FIG. 3 illustrates in block diagram form an improved mixer-system according to the invention which suppresses a higher harmonic.

The improved mixer-system according to the invention shown in FIG. 3 suppresses a higher harmonic. This improved mixer-system corresponds with the basic mixer-system according to the invention shown in FIG. 1, with the following addition.

Second main electrode (E) of gain-block 1 is coupled via an eighth impedance 18 (like for example a resistor etc.) to a first main electrode of a third switch 7 (for example comprising one or more switch-transistors, like a MOSFET). Second main electrode (E) of gain-block 2 is coupled via a nineth impedance 19 (like for example a resistor etc.) to a second main electrode of third switch 7. A control electrode of switch 7 is coupled to a first output of a further oscillator 35 for receiving a further first oscillation signal.

Second main electrode (E) of gain-block 4 is coupled via a tenth impedance 20 (like for example a resistor etc.) to a first main electrode of a fourth switch 8 (for example comprising one or more switch-transistors, like a MOSFET). Second main electrode (E) of gain-block 3 is coupled via an eleventh impedance 21 (like for example a resistor etc.) to a second main electrode of fourth switch 8. A control electrode of switch 8 is coupled to a second output of further oscillator 35 for receiving a further second oscillation signal.

By providing the mixer-system with the third and fourth switches 7 and 8 and with further oscillator 35, which further oscillator 35 for example generates further oscillation signals for example comprising further square wave signals at for example three or five or seven times etc. the frequency of the (basic) oscillation signals comprising for example the (basic) square wave signals (as discussed for FIG. 1), the third of fifth or seventh harmonic etc. is suppressed. So, for each harmonic to be suppressed, two switches (a mixer) and an oscillator need to be added. Dependently upon the gain of the mixer-system related to this third or fifth or seventh harmonic etc., values for the (further) oscillator and/or values for the (further) impedances will need to be chosen properly.

Oscillators 34 and 35 for example each comprise a sine generator of which outputs are coupled to inputs of a limiter (for converting the sines into square waves). Outputs of the limiter for the outputs of the oscillator, with the first output further being coupled via a resistor to voltage source 41 (for biasing purposes) and with the second output further being coupled via a resistor to voltage source 41 (for biasing purposes). Alternatively, oscillator signals may be derived via one or more dividers from a single oscillator.

Figure 4:
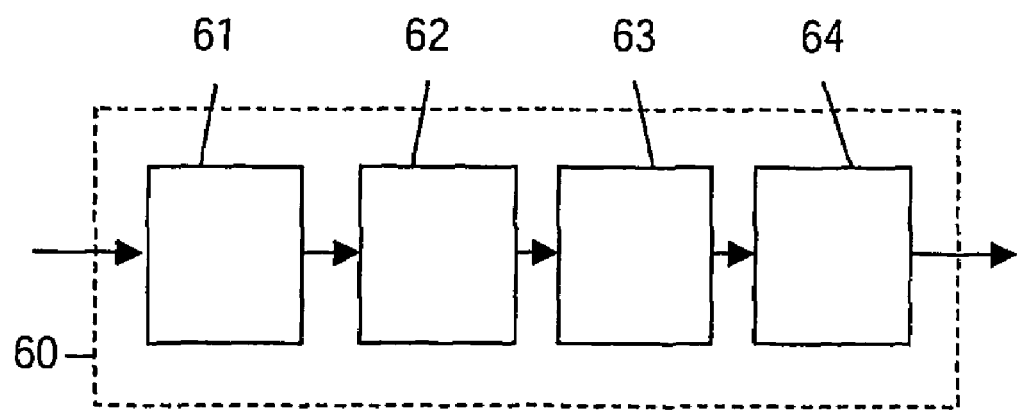
FIG. 4 illustrates in block diagram form an apparatus according to the invention.

The apparatus 60 according to the invention shown in FIG. 4 for example corresponds with a receiver for receiving modulated signals to be mixed (to be frequency translated or frequency converted) downwardly and then comprises for example an input stage 61 (like for example an antenna and/or one or more pre-amplifiers and/or one or more filters etc.) and a mixer-system 62 as shown in FIGS. 1 and 3 and as described above and a processing stage 63 (like for example one or more processors and/or one or more gain-blocks etc.) and an output stage 64 (like for example one or more man-machine-interfaces etc.) etc.

Or the apparatus 60 according to the invention shown in FIG. 4 for example corresponds with a transmitter for transmitting modulated signals to be mixed (to be frequency translated or frequency converted) upwardly etc. and comprises an input stage 61 (like for example one or more man-machine-interfaces etc.) and a processing stage 62 (like for example one or more processors and/or one or more gain-blocks etc.) and a mixer-system 63 as shown in FIGS. 1 and 3 and as described above and an output stage 64 (like for example an antenna and/or one or more power-amplifiers and/or one or more filters etc.) etc.

Generally, but not exclusively, a first main electrode will correspond with a collector or a drain, a second main electrode will correspond with an emitter or a source, and a control electrode will correspond with a basis or a gate.

The expression "for" in for example "for A" and "for B" does not exclude that one or more other functions like "for C" etc. are performed as well, simultaneously or not. The expressions "X coupled to Y" and "a coupling between X and Y" and "coupling/couples X and Y" etc. do not exclude that an element Z is in between X and Y. The expressions "P comprises Q" and "P comprising Q" etc. do not exclude that an element R is comprised/included as well.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention is based upon an insight, inter alia, that the flexibility of a mixer-system depends upon its configuration, and is based upon a basic idea, inter alia, that for a more flexible configuration data input signals are to be supplied to the gain-blocks and that oscillation signals are to be supplied to switches for switching couplings between gain-blocks.

The invention solves the problem, inter alia, of providing a more flexible mixer-system, and is advantageous, inter alia, in that its performance is improved and can be further improved easily.

The invention claimed is:

1. Mixer-system comprising gain-blocks (1-4) and switches (5-8), wherein control electrodes of a first (1), a second (2), a third (3) and a fourth (4) gain-block constitute data inputs for guiding data input signals, with first main electrodes of the first (1) and third (3) gain-block being coupled to each other and to a first impedance (11) and with first main electrodes of the second (2) and fourth (4) gain-block being coupled to each other and to a second impedance (12) for constituting outputs (32,33) for guiding output signals, and with second main electrodes of the first (1) and second (2) gain-block being coupled to each other via a first switch (5) and with second main electrodes of the third (3) and fourth gain-block (4) being coupled to each other via a second switch (6), with control electrodes of the switches (5,6) constituting oscillation inputs for guiding oscillation signals.

2. Mixer-system according to claim 1, wherein each switch (5,6) comprises at least one switch-transistor, with each gain-block (1-4) comprising at least one gain-block-transistor.

3. Mixer-system according to claim 2, wherein a first main electrode of the first switch (5) is coupled to the second main electrode of the first gain-block (1) via a third impedance (13), with a second main electrode of the first switch (5) being coupled to the second main electrode of the second gain-block (2) via a fourth impedance (14), with a first main electrode of the second switch (6) being coupled to the second main electrode of the fourth gain-block (4) via a fifth impedance (15), with a second main electrode of the second switch (6) being coupled to the second main electrode of the third gain-block (3) via a sixth impedance (16), and with the control electrodes of the second (2) and third (3) gain-blocks being coupled to a voltage guiding terminal via a seventh impedance (17).

4. Mixer-system according to claim 2, wherein a first main electrode of the first switch (5) is coupled to the second main electrode of the first gain-block (1) via a third impedance (13), with a second main electrode of the first switch (5) being coupled to the second main electrode of the second gain-block (2) directly, with a first main electrode of the second switch (6) being coupled to the second main electrode of the fourth gain-block via a fifth impedance (15), with a second main electrode of the second switch (6) being coupled to the second main electrode of the third gain-block (3) directly, and with the control electrodes of the second (2) and third (3) gain-blocks being coupled to a voltage guiding terminal directly.

5. Mixer-system according to claim 2, wherein the mixer-system comprises a third switch (7) parallel to the first switch (5) and a fourth switch (8) parallel to the second switch (6), with control electrodes of the third (7) and fourth (8) switch constituting further oscillation inputs for guiding further oscillation signals.

6. Mixer-system according to claim 5, wherein a first main electrode of the third switch (7) is coupled to the second main electrode of the first gain-block (1) via an eighth impedance (18), with a second main electrode of the third switch (7) being coupled to the second main electrode of the second gain-block (2) via a nineth impedance (19), with a first main electrode of the fourth switch (8) being coupled to the second main electrode of the fourth gain-block (4) via a tenth impedance (20), with a second main electrode of the fourth switch (8) being coupled to the second main electrode of the third gain-block (3) via an eleventh impedance (21), and with the control electrodes of the second (2) and third (3) gain-blocks being coupled to a voltage guiding terminal via a seventh impedance (17).

7. Mixer-system according to claim 5, wherein a first main electrode of the third switch (7) is coupled to the second main electrode of the first gain-block (1) via an eighth impedance (18), with a second main electrode of the third switch (7) being coupled to the second main electrode of the second gain-block (2) directly, with a first main electrode of the fourth switch (8) being coupled to the second main electrode of the fourth gain-block (4) via a tenth impedance (20), with a second main electrode of the fourth switch (8) being coupled to the second main electrode of the third gain-block (3) directly, and with the control electrodes of the second (2) and third (3) gain-blocks being coupled to a voltage guiding terminal directly.

8. Mixer-system according to claim 1, wherein each switch (5,6) comprises at least one switch-transistor, with each gain-block (10) comprising at least a first (51), a second (52), a third (53), a fourth (54) and a fifth (55) gain-block-transistor, with a control electrode of the first gain-block-transistor (51) constituting the control input of the gain-block (10), with a first main electrode of the first gain-block-transistor (51) being coupled to a first main electrode and to a control electrode of the second gain-block-transistor (52) and to a control electrode of the third gain-block-transistor (53), with a second main electrode of the second gain-block-transistor (52) being coupled to a second main electrode of the third gain-block-transistor (53) and to a voltage guiding terminal, with a second main electrode of the first gain-block-transistor (51) being coupled to a second main electrode of the fourth gain-block-transistor (54) and to a current guiding terminal, with a control electrode of the fourth gain-block-transistor (54) constituting the second main electrode of the gain-block (10) and being coupled to a second main electrode of the fifth gain-block-transistor (55), with a first main electrode of the fourth gain-block-transistor (54) being coupled to a control electrode of the fifth gain-block-transistor (55) and to a first main electrode of the third gain-block-transistor (53), and with a first main electrode of the fifth gain-block-transistor (55) constituting a first main electrode of the gain-block (10).

9. Gain-block-system (1-4) for use in a mixer-system comprising gain-blocks (1-4) and switches (5-8), wherein control electrodes of a first (1), a second (2), a third (3) and a fourth (4) gain-block constitute data inputs for guiding data input signals, with first main electrodes of the first (1) and third (3) gain-block being coupled to each other and to a first impedance (11) and with first main electrodes of the second (2) and fourth (4) gain-block being coupled to each other and to a second impedance (12) for constituting outputs for guiding output signals, and with second main electrodes of the first (1) and second (2) gain-block being coupled to each other via a first switch (5) and with second main electrodes of the third (3) and fourth (4) gain-block being coupled to each other via a second switch (6), with control electrodes of the switches (5,6) constituting oscillation inputs for guiding oscillation signals, which gain-block-system (1-4) comprises the first (1), the second (2), the third (3) and the fourth (4) gain-block.

10. Mixer (5-8) for use in a mixer-system comprising gain-blocks (1-4) and switches (5-8), wherein control electrodes of a first (1), a second (2), a third (3) and a fourth (4) gain-block constitute data inputs for guiding data input signals, with first main electrodes of the first (1) and third (3) gain-block being coupled to each other and to a first impedance (11) and with first main electrodes of the second (2) and fourth (4) gain-block being coupled to each other and to a second impedance (12) for constituting outputs for guiding output signals, and with second main electrodes of the first (1) and second (2) gain-block being coupled to each other via a first switch (5) and with second main electrodes of the third (3) and fourth (4) gain-block being coupled to each other via a second switch (6), with control electrodes of the switches (5,6) constituting oscillation inputs for guiding oscillation signals, which mixer comprises the first (5) and the second (6) switch.

11. Apparatus (60) which comprises a mixer-system (62 or 63) comprising gain-blocks (1-4) and switches (5-8), wherein control electrodes of a first (1), a second (2), a third (3) and a fourth (4) gain-block constitute data inputs for guiding data input signals, with first main electrodes of the first (1) and third (3) gain-block being coupled to each other and to a first impedance (11) and with first main electrodes of the second (2) and fourth (4) gain-block being coupled to each other and to a second impedance (12) for constituting outputs for guiding output signals, and with second main electrodes of the first (1) and second (2) gain-block being coupled to each other via a first switch (5) and with second main electrodes of the third (3) and fourth (4) gain-block being coupled to each other via a second switch (6), with control electrodes of the switches (5,6) constituting oscillation inputs for guiding oscillation signals.

12. Method for mixing data input signals and oscillation signals via gain-blocks (1-4) and switches (5-8), which method comprises the steps of guiding data input signals at control electrodes of a first (1), a second (2), a third (3) and a fourth (4) gain-block, and of guiding output signals at first main electrodes of the first (1) and third (3) gain-block coupled to each other and to a first impedance (11) and at first main electrodes of the second (2) and fourth (4) gain-block coupled to each other and to a second impedance (12), and of guiding oscillation signals at control electrodes of a first (5) and a second (6) switch, with second main electrodes of the first (1) and second (2) gain-block being coupled to each other via the first switch (5) and with second main electrodes of the third (3) and fourth (4) gain-block being coupled to each other via the second switch (6).

\* \* \* \* \*